United States Patent

[11] 3,588,730

[72] Inventors Walter Schreuer
Ipswich;
Leopold Neumann, Lexington; Sherman Rigby, Boston, all of Mass.
[21] Appl. No. 875,265
[22] Filed Nov. 10, 1969
[45] Patented June 28, 1971
[73] Assignee Gordon Engineering Company
Wakefield, Mass.

[54] VARIABLE FREQUENCY GENERATOR COMBINING OUTPUTS OF TWO PHASE LOCKED LOOPS
11 Claims, 1 Drawing Fig.

[52] U.S. Cl. 331/2, 331/22, 331/25, 331/40, 331/41
[51] Int. Cl. H03b 3/04
[50] Field of Search 331/2, 18, 22, 25, 37, 40, 41

[56] References Cited
UNITED STATES PATENTS

| | | | |
|---|---|---|---|
| 2,775,701 | 12/1956 | Israel | 331/2 |
| 2,942,203 | 6/1960 | Winkler | 331/2 |
| 3,217,267 | 11/1965 | Lopuser | 331/18X |
| 3,354,403 | 11/1967 | Thomas | 331/18 |

FOREIGN PATENTS

| | | | |
|---|---|---|---|
| 888,587 | 1/1962 | Great Britain | 331/2 |

*Primary Examiner*—Roy Lake
*Assistant Examiner*—Siegfried H. Grimm
*Attorney*—Morse, Latman and Oates

ABSTRACT: In a precision radio frequency signal generator, an output from a digitally controlled phase locked frequency synthesizer loop is mixed with an output from a tunable phase locked variable frequency oscillator loop to provide a range of accurate frequency RF signals. The signal generator is provided with a display wherein the frequency of the signal is presented by an indicator.

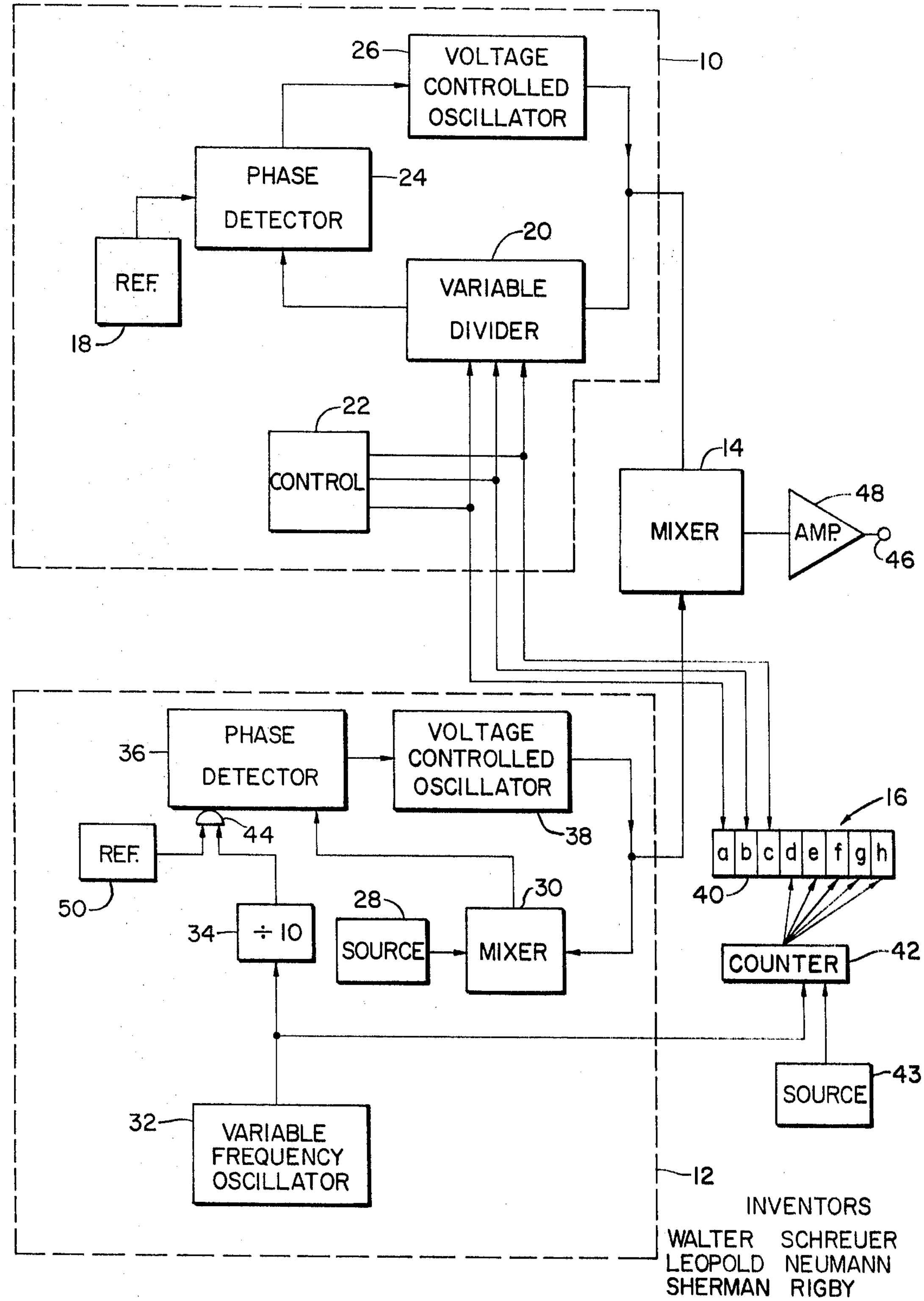
INVENTORS
WALTER SCHREUER
LEOPOLD NEUMANN
SHERMAN RIGBY
BY Morse, Altman & Oates
ATTORNEYS

VARIABLE FREQUENCY GENERATOR COMBINING OUTPUTS OF TWO PHASE LOCKED LOOPS

BACKGROUND AND SUMMARY OF THE INVENTION

The present invention relates to radio frequency (RF) generating devices and more particularly to the generation of RF signals of precision frequencies. Basically, there are two types of tunable instruments used for generation of RF signals, the signal generator and the frequency synthesizer. There is a great divergence between the performance characteristics, complexity, and cost of these two instruments. The signal generator lacks the precision of the synthesizer and the cost of the synthesizer is six times that of the signal generator. In many applications, the signal generator does not provide the required frequency stability and accuracy while the synthesizer provides frequency stability and accuracy in excess of that required. A need has arisen for a precise and inexpensive tunable instrument for generating accurate frequency signals. Accordingly, the primary object of the present invention is to provide a tunable instrument for generating RF signals of precise frequencies characterized by a phase locked frequency synthesizer loop for generating precise frequency signals in discrete steps, a phase locked variable frequency oscillator loop for generating a range of continuous frequency signals and a mixer for combining the output signals of each loop. The combination of the frequency synthesizer loop, the variable frequency loop, and the mixer is such as to provide a precise and inexpensive discrete frequency generator.

Another object of the present invention is to provide a tunable instrument for generating a single precise crystal controlled frequency characterized by a tunable phase locked frequency synthesizer loop, a crystal controlled phased locked oscillator loop, and a mixer for combining the output signals of each loop.

A further object of the present invention is to provide a novel display system characterized by a plurality of indicator tubes and a divide by 10 circuit, the combination of which eliminates the necessity of providing a latching circuit.

The invention accordingly comprises the apparatus possessing the construction, combination of elements, and arrangements of parts that are exemplified in the following detailed disclosure, the scope of which will be indicated in the appended claims.

BRIEF DESCRIPTION OF DRAWINGS

For a fuller understanding of the nature and objects of the present invention, reference should be had to the following detailed description, taken in connection with the accompanying block diagram of a discrete frequency generator embodying the present invention.

DETAILED DESCRIPTION OF THE PREFERRED EMBODIMENT

Generally, the frequency generator comprises a phase locked frequency synthesizer loop 10 for providing a plurality of precise frequency signals in discrete steps, a phase locked variable frequency oscillator loop 12 for providing a range of stable signals, a mixer 14 for combining the output signals from synthesizer loop 10 and oscillator loop 12, and a display 16 for presenting an indication of the frequency of the signal as at the output of mixer 14. Synthesizer loop 10 includes a reference source 18 for providing a fixed frequency signal, a variable divider 20 for providing an output signal proportional to an input signal thereat, a control 22 for specifying the frequency of the signal as at the input of variable divider 20, a phase detector 24 for providing an output signal which is a function of the phase difference between the signals as at the output of reference source 18 and variable divider 20, and a voltage controlled oscillator 26 for providing an input signal to mixer 14 and variable divider 20 in response to the signal as at the output of phase detector 24. In general, variable frequency oscillator loop 12 includes a stable source 28 for providing a fixed frequency signal, a mixer 30 for providing an output signal responsive to input signals applied thereto, a tunable variable frequency oscillator 32 for providing a band of signals of precise frequencies over the range specified by the interstep frequency separations of loop 10, a divide by 10 circuit 34 for providing an output signal which is one-tenth the frequency of the signal as at the output of variable frequency oscillator 32, a phase detector 36 for providing an output signal which is a function of the phase difference between the signals as at the output of mixer 30 and divide by 10 circuit 34, and a voltage controlled oscillator 38 for providing an input signal to mixers 14 and 30 in response to the signal as at the output of phase detector 36. Display 16 includes a plurality of indicators 40 which are designated *a* through *h*. Output signals from control 22 are applied to indicators *a*, *b*, and *c*, and output signals from variable frequency oscillator 32 are applied to indicators *d*, *e*, *f*, *g*, and *h* via a counter 42. A precise frequency signal from a source 43 is applied to counter 42 as a reference. For convenience, the operation of the synthesizer loop and the variable frequency oscillator loop will be discussed separately.

Typically, the frequency generator provides a discrete signal in the 0—40 MHz. range continuously variable in frequency in 100 MHz. wide bands. It will be understood that, in alternative embodiments the range is other than 0—40 mHz., for example 5—30 MHz., and the continuous wide bands are other than 100 kHz. for example 50 kHz. Control 22 specifies the tens, units, and tenths MHz. digits of the signal as at the output of mixer 14 on indicators *a*, *b*, and *c*, respectively, and variable frequency oscillator 32 specifies the tens, units, tenths, hundredths, and thousandths kHz. digits of the signal as at the output of mixer 14. In the preferred embodiment of the present invention, indicators *a* through *g* are numerical indicator devices and indicator *h* is a symbolic indicator device such as a "+" or "−" indicator. The "+" or "−" as presented by indicator *h* being representative of a too high and too low setting, respectively, of variable frequency oscillator 32.

Initially, voltage controlled oscillator 26 is assumed to be free running. Control 22 is programmed for a given signal by means of decade switches (not shown), for example, whereby the frequency of the signal as at the input of variable divider 20 is proportional to the frequency of the output signal thereat. The ratio of input signal to output signal of variable divider 20 is specified by control 22. The signal as at the output of variable divider 20 and the fixed frequency signal from reference source 18 are applied to phase detector 24, in consequence an output signal which is a function of the phase difference between the two signals is applied to an input of voltage controlled oscillator 26. The signal as at the output of voltage controlled oscillator 26, the frequency of which is specified by phase detector 24, is applied to the input of variable divider 20 in consequence of which the loop is closed and the signal as at the output of voltage controlled oscillator 26 is stabilized at a frequency specified by control 22. It will be readily appreciated that, in an alternative embodiment of the present invention, indicators 40 *a*, *b*, and *c* are direct reading devices, for example, control 22 is programmed by means of digit switches.

In the phase locked variable frequency loop 12, variable frequency oscillator 32 is programmed to provide a signal of given frequency, whereby a signal of 10 times the selected frequency is applied to divide by 10 circuit 34. It is understood that, in an alternative embodiment, the signal as at the output of variable frequency oscillator 32 is applied directly to 44 or is applied to 44 via a dividing circuit which is other than 10 for example, five or eight. The signal as at the output of 34 and fixed frequency signal from reference 50 are applied to phase detector 36 via a logic circuit 44, for example an OR gate. The signal as at the output of phase detector 36 is applied to an input of voltage controlled oscillator 38, whereby voltage controlled oscillator 38 generates a signal whose frequency is dependent on phase detector 36. The signal as at the output of voltage controlled oscillator 38 is applied to the input of mixer 30, in consequence of which the loop is closed and the signal as at the output of voltage controlled oscillator 38 is stabilized at a frequency specified by variable frequency oscillator 32.

The stabilized signals as at the output of voltage controlled oscillators 26 and 38 are applied to mixer 14, whereby the two signals are arithmetically combined in such a manner that the frequency of the signal as at the output of mixer 14 is the difference between the frequency of the signals as at the output of voltage controlled oscillator 26 and the frequency of the signal as at the output of voltage controlled oscillator 38. The signal as at the output of mixer 14 is applied to an output terminal 46 via an amplifier 48, whereby a continuous range of signals of a precise frequency is made available at terminal 46.

As previously stated, the signals as at the output of control 22 are applied directly to indicators, *a*, *b*, and *c* of display 16 and the signal as at the output variable frequency oscillator 32 is applied to indicators *d*, *e*, *f*, *g*, and *h* via counter 42. For convenience, display 16 is provided with a decimal point (not shown) between *e* and *f*, and the units are kilohertz. Counter 42 determines the frequency of the signal as at the output of variable frequency oscillator 32 each one-hundredth of a kilohertz, whereby indicators *d*, *e*, *f*, *g*, and *h* appear to be illuminated continuously. If the signal as at the output of variable frequency oscillator 32 is not 10 times the specified frequency but rather the specified frequency, indicators *d*, *e*, *f*, *g*, and *h* would appear to be blinking on and off. In order to eliminate this on and off blinking appearance of the indicators, a latching circuit would be required. However, by increasing the frequency applied to counter 42 10-fold, there is no visible blinking and a latching circuit is not required.

To further illustrate the present invention, a typical example will be given wherein the signal as at reference 18 is 100 kHz., the signal as at reference 28 is 130 MHz. the signal as at the output of voltage controlled oscillator 26 is between 129 and 168.9 MHz., the signal as at the output of voltage controlled oscillator 38 is 129—128.9 MHz., and the signal as at terminal 46 is 0—40 mHz. In one example, it is desired that the signal as at terminal 46 is 20.03200 MHz. Control 22 is programmed for the first three digits, i.e. 200, in consequence variable divider 20 is specified to divide its input signal by 1490. Therefore, loop 10 is stabilized when the frequency of the signal as at the output of voltage controlled oscillator is 149.0 MHz. When the signal as at the output voltage controlled oscillator 26 is 149.0 MHz., the signal as at the output of variable divider 20 is 100 kHz., in consequence the signals at the inputs of phase detector 24 are of the same frequency and loop 10 is stabilized at 149.0 MHz. Variable frequency oscillator 32 is programmed to generate a frequency of 10.3200 MHz. Therefore, loop 12 is stabilized when the frequency of the signal as at the output of voltage controlled oscillator 38 is 128.96800 MHz. When the signal as at the output of voltage controlled oscillator 38 is 128.96800 MHz., the signal as at the output of mixer 30 is 1.03200 MHz. (130 MHz. reference less 128.96800 MHz.) The frequency of the signal as at the output of variable frequency oscillator 32 is divided by 10 via 34 and applied to phase detector 36. Since the frequency of the signals as at the inputs of phase detector 36 are of the same frequency, loop 12 is stabilized at 128.96800 MHz. The 149.0 MHz. and 128.96800 MHz. signals as at the output of voltage controlled oscillators 26 and 38, respectively, are combined in mixer 14, in consequence the output of mixer 14 is 20.03200 MHz. (149.0—128.968 MHz.)

It will be readily appreciated that, the frequency generator is also a frequency standard. In this embodiment, a stable signal from a reference source 50 is applied to phase detector 36 via OR gate 44, in consequence the signal as at the output of variable frequency loop 12 is of a single frequency as specified by source 50. The signal as at the output of loops 10 and 12 are combined in mixer 14 whereby the signal as at terminal 46 is an RF signal of precise frequency in discrete steps as specified by the programming of control 22.

Although shown separately, in the preferred embodiment of the present invention, references 18, 28, and 50 and source 43 are derived from a common stable source.

Since certain changes may be made in the foregoing disclosure without departing from the scope of the invention herein involved, it is intended that all matter contained in the above description and shown in the accompanying drawing be construed in an illustrative and not in a limiting sense.

We claim:

1. A tunable device for generating signals of precise frequency, said device comprising:

a. phase locked frequency synthesizer loop means for generating precise frequency signals in discrete steps;
b. variable frequency oscillator means;
c. first reference source means for providing a signal of a given frequency;
d. second reference source means for providing a signal of a given frequency;
e. first mixer means;
f. first phase detector means having at least first and second inputs, said variable frequency oscillator means and second reference source means operatively connected to said first input, said first mixer means operatively connected to said second input;
g. first voltage controlled oscillator means electrically connected to said first phase detector means and said first mixer means, the input of said first voltage controlled oscillator means being connected to the output of said first phase detector means and the output of said first voltage oscillator means being connected to the input of said first mixer means, the frequency of the signal as at the output of said first voltage controlled oscillator being specified by the signal as at the output of said first phase detector means;
h. second mixer means operatively connected to said phase locked frequency synthesizer loop means and the output of said first voltage controlled oscillator means; and
i. output means operatively connected to said second mixer means for presenting the signal as at the output of said mixer, said presented signal being of precise frequency.

2. The tunable device of claim 1 wherein said phase locked frequency synthesizer loop means includes:

a. third reference source means for providing a signal of a given frequency;
b. variable divider means for providing an output signal which is proportional to an input signal applied thereto;
c. control means operatively connected to said variable divider means for specifying the input signal of said variable divider means;
d. second phase detector means having at least first and second inputs, said second phase detector means electrically connected to said third reference source means and variable divider means for providing an output signal which is specified by the phase difference between the signal as at the output of said third reference source means and variable divider means, the signal as at the output of said third reference source means being applied to a first input of said second phase detector means and the signal as at the output of said variable divider means being applied to a second input of said second phase detector means; and
e. second voltage controlled oscillator means electrically connected to said second phase detector means and variable divider means, the input of said second voltage controlled oscillator means being connected to the output of said second phase detector means and the output of said second voltage controlled oscillator means being connected to the input of said variable divider, the frequency of the signal as at the output of said second voltage controlled oscillator being specified by the signal as at the output of said second phase detector means.

3. The device of claim 1 wherein said variable frequency oscillator means is operatively connected to said first phase detector means via divide circuit means, said divide circuit means being operatively connected between the output of said variable frequency oscillator means and the first input of said first phase detector means, whereby the frequency of the signal as at the first input of said first phase detector means is a fraction of the frequency of the signal as at the output of said variable frequency oscillator means.

4. A tunable device for generating a plurality of signals, of discrete frequency, said device comprising:

a. first reference source means for providing a signal of a given frequency;

b. variable divider means for providing an output signal which is proportional to an input signal applied thereto;

c. control means operatively connected to said variable divider means for specifying the signals as at the input of said variable divider means;

d. first phase detector means electrically connected to said first reference source means and variable divider means for providing an output signal which is specified by the phase difference between the signals as at the output of said first reference source means and variable divider means; the signal as at the output of said first reference source means being applied to a first input if said first phase detector means and the signal as at the output of said variable divider means being applied to a second input of said first phase detector means;

e. first voltage controlled oscillator means electrically connected to said first phase detector means and variable divider means, the input of said first voltage controlled oscillator means being connected to the output of said first phase detector means and the output of said first voltage controlled oscillator means being connected to the input of said variable divider, the frequency of the signal as at the output of said first voltage controlled oscillator being specified by the signal as at the output of said first phase detector means;

f. oscillator means for providing at least one signal of precise frequency;

g. second reference source means for providing a signal of a given frequency;

h. first mixer means;

i. second phase detector means operatively connected to said oscillator means and operatively connected to said second reference source means via said first mixer means, the signal as at the output of said oscillator means being applied to a first input of said second phase detector means and the signal as at the output of said mixer means being applied to a second input of said second phase detector means, the signal as at the output of said second phase detector means being specified by the phase difference between the signals as at said first and second inputs;

j. second voltage controlled oscillator means electrically connected to said second phase detector means and said first mixer means, the input of said second voltage controlled oscillator means being connected to the output of said second phase detector means and the output of said second voltage controlled oscillator means being connected to the input of said first mixer means, the frequency of the signal as at the output of said second voltage controlled oscillator being specified by the signal as at the output of said second phase detector means;

k. second mixer means operatively connected to each of the outputs of said first and second voltage controlled oscillator means for combining the output signals of each of said voltage controlled oscillator means whereby the combined signal as at the output of said mixer means is a signal of precise frequency;

l. counter means electrically connected to said oscillator means for specifying the frequency of the signal as at the output of said oscillator means; and m. display means operatively connected to said control means and counter means for presenting the frequency of the signal as at the output of said second mixer means.

5. The device of claim 4 wherein said oscillator means is operatively connected to said second phase detector means via a divide by 10 circuit, said divide by 10 circuit being operatively connected between the output of said oscillator means and the first input of said second phase detector means, whereby the frequency of the signal as at the input of said counter is 10 times the frequency of the signal as at the first input of said second phase detector means.

6. The device of claim 4 wherein said oscillator means is a third reference source means for providing a signal of a given frequency, the signal as at the output of said second mixer means being a range of precise frequency signals in discrete steps.

7. The device of claim 4 wherein said oscillator means is a tunable variable frequency oscillator, the signal as at the output of said second mixer means being a continuous range of precise frequency signals.

8. The device of claim 4 wherein the frequency range of the signal as at the output of said first voltage controlled oscillator means is from 129 MHz. to 168.9 MHz., the frequency range of the signal as at the output of said second voltage controlled oscillator is 129 to 128.9 MHz., and the frequency range of the signal as at the output of said second mixer means is from 0 to 40 MHz.

9. The device of claim 5 wherein said display means includes a plurality of numerical indicating devices.

10. The device of claim 4 wherein an OR gate is electrically connected to the first input of said second phase detector means for specifying the signal which is applied to said second phase detector means via said first input thereof.

11. The device of claim 4 wherein said oscillator means is operatively connected to said first phase detector means via divide circuit means, said divide circuit means being operatively connected between the output of said variable frequency oscillator means and the first input of said second phase detector means, whereby the frequency of the signal as at the first input of said second phase detector means is a fraction of the signal as at the input of said counter means.